United States Patent
Baranwal et al.

(10) Patent No.: US 12,095,429 B2
(45) Date of Patent: Sep. 17, 2024

(54) CURRENT LIMIT FOR CHARGE PUMP BOOST DRIVEN CLASS D AUDIO AMPLIFIER

(71) Applicant: Texas Instruments Incorporated, Dallas, TX (US)

(72) Inventors: Shailendra Kumar Baranwal, Murphy, TX (US); Yogesh Kumar Ramadass, San Jose, CA (US); Yinglai Xia, Plano, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 463 days.

(21) Appl. No.: 17/461,495

(22) Filed: Aug. 30, 2021

(65) Prior Publication Data

US 2023/0065567 A1  Mar. 2, 2023

(51) Int. Cl.
*H03F 3/217* (2006.01)
*H03F 1/02* (2006.01)
*H04R 3/00* (2006.01)

(52) U.S. Cl.
CPC ......... *H03F 3/2171* (2013.01); *H03F 1/0205* (2013.01); *H04R 3/00* (2013.01); *H03F 2200/03* (2013.01)

(58) Field of Classification Search
CPC .. H03F 3/2171; H03F 1/0205; H03F 2200/03; H03F 1/0216; H03F 3/45475; H03F 3/2173; H03F 3/38; H03F 3/217; H03F 2200/351; H04R 3/00
USPC ........................ 330/10, 207 A, 251
See application file for complete search history.

(56) References Cited

U.S. PATENT DOCUMENTS

| | | | |
|---|---|---|---|
| 6,794,926 B2 | 9/2004 | Radar et al. | |
| 7,276,960 B2 | 10/2007 | Peschke et al. | |
| 7,403,066 B2 * | 7/2008 | Williams | H03F 3/217 330/10 |
| 9,054,646 B2 | 6/2015 | Seven | |
| 9,425,747 B2 | 8/2016 | Bazarjani et al. | |
| 9,647,617 B2 | 5/2017 | Buono et al. | |
| 11,671,013 B2 * | 6/2023 | Khamesra | H02M 1/36 327/538 |
| 2019/0097612 A1 | 3/2019 | Burgener et al. | |
| 2022/0069711 A1 * | 3/2022 | Karri | H02M 1/0016 |

* cited by examiner

*Primary Examiner* — Khanh V Nguyen
(74) *Attorney, Agent, or Firm* — Ray A. King; Frank D. Cimino

(57) ABSTRACT

Described embodiments include an audio amplifier circuit that includes a first amplifier having a differential first amplifier input adapted to be coupled to an audio input source, a multiplexer having first and second mux inputs, a control input and a mux output. The first mux input is coupled to the differential amplifier output. There is a signal generator having a generator input coupled to the mux output. There is also a driver circuit having a driver circuit input and a driver circuit output, the driver circuit input coupled to the generator output, and a second amplifier having a first error input coupled to a current sense terminal that is configured to provide a voltage proportional to a current supplied from a power supply terminal, and a second error input coupled to a current limit terminal configured to provide a reference voltage proportional to a current limit value.

23 Claims, 4 Drawing Sheets

CURRENT LIMIT FOR CHARGE PUMP BOOST DRIVEN CLASS D AUDIO AMPLIFIER

BACKGROUND

This description relates to class D audio amplifiers, and in particular, current limiting in class D audio amplifiers. Limiting the current drawn by an audio amplifier is particularly important in portable battery-powered systems because it directly impacts the operational time of the battery before requiring recharging.

A class-D amplifier is an electronic amplifier in which the amplifying devices operate as electronic switches, and not as linear gain devices as may be the case in other types of amplifiers. Class D amplifiers operate by rapidly switching back and forth between the positive and negative supply rails, or between the positive supply rail and ground. The switches in a class D amplifier are controlled by a modulator output using pulse width, pulse density, or a similar technique to encode the audio input into a pulse train.

In a pulse-width modulated amplifier, the duty cycle or on-time of the transistors is directly proportional to the power delivered to the load. The power delivered to the load is proportional to the battery current. So, battery current can be controlled by controlling the duty cycle of the pulse-width modulator.

SUMMARY

In a first described embodiment, an audio amplifier circuit includes a first amplifier having a differential first amplifier input and a differential first amplifier output. The differential first amplifier input adapted to be coupled to an audio input source. The first described embodiment also presents a multiplexer having first and second mux inputs, a control input and a mux output. The first mux input is coupled to the differential amplifier output. There is a signal generator having a generator input and a generator output, and the generator input is coupled to the mux output.

The first described embodiment also includes a driver circuit having a driver circuit input and a driver circuit output, the driver circuit input being coupled to the generator output, and a second amplifier having first and second error inputs and an error output, the first error input coupled to a current sense terminal configured to provide a voltage proportional to a power supply current, the second error input coupled to a current limit terminal that is configured to provide a reference voltage proportional to a current limit value.

The second described embodiment presents a speaker system that includes a first amplifier having a differential first amplifier input and a differential first amplifier output, the differential first amplifier input adapted to be coupled to an audio input source. There is a multiplexer having first and second mux inputs, a control input and a mux output. The first mux input is coupled to the differential first amplifier output.

The second embodiment also includes a signal generator having a generator input and a generator output, the generator input coupled to the mux output, and a driver circuit having a driver circuit input and a driver circuit output. The driver circuit input is coupled to the generator output, and the driver circuit output is differential and coupled to first and second speaker drive terminals. There is a speaker having first and second speaker terminals coupled, respectively, to the first and second speaker drive terminals, and a second amplifier having first and second error inputs and an error output, the first error input coupled to a current sense terminal configured to provide a voltage proportional to a current supplied from the power source, the second error input coupled to a current limit terminal configured to provide a reference voltage proportional to a current limit value.

The third described embodiment presents an audio amplifier circuit that includes a first amplifier having a differential first amplifier input and a differential first amplifier output, the differential first amplifier input adapted to be coupled to an audio input source, a multiplexer having first and second mux inputs, a control input and a mux output, the first mux input coupled to the differential first amplifier output. There is a signal generator having a generator input and a generator output, the generator input coupled to the mux output, and a driver circuit having a driver circuit input and a driver circuit output, the driver circuit input is coupled to the generator output, and the driver circuit output is differential and coupled to first and second speaker drive terminals.

The third embodiment includes a second amplifier having first and second error inputs and an error output, the first error input coupled to a current sense terminal configured to provide a voltage proportional to a power supply current, the second error input coupled to a current limit terminal configured to provide a reference voltage proportional to a current limit value. The multiplexer selects the first mux input when the power supply current is less than the current limit value, and selects the second mux input when the power supply current is greater than the current limit value.

DETAILED DESCRIPTION

In this description, the same reference numbers depict the same or similar (by function and/or structure) features. The drawings are not necessarily drawn to scale.

Figure 1:
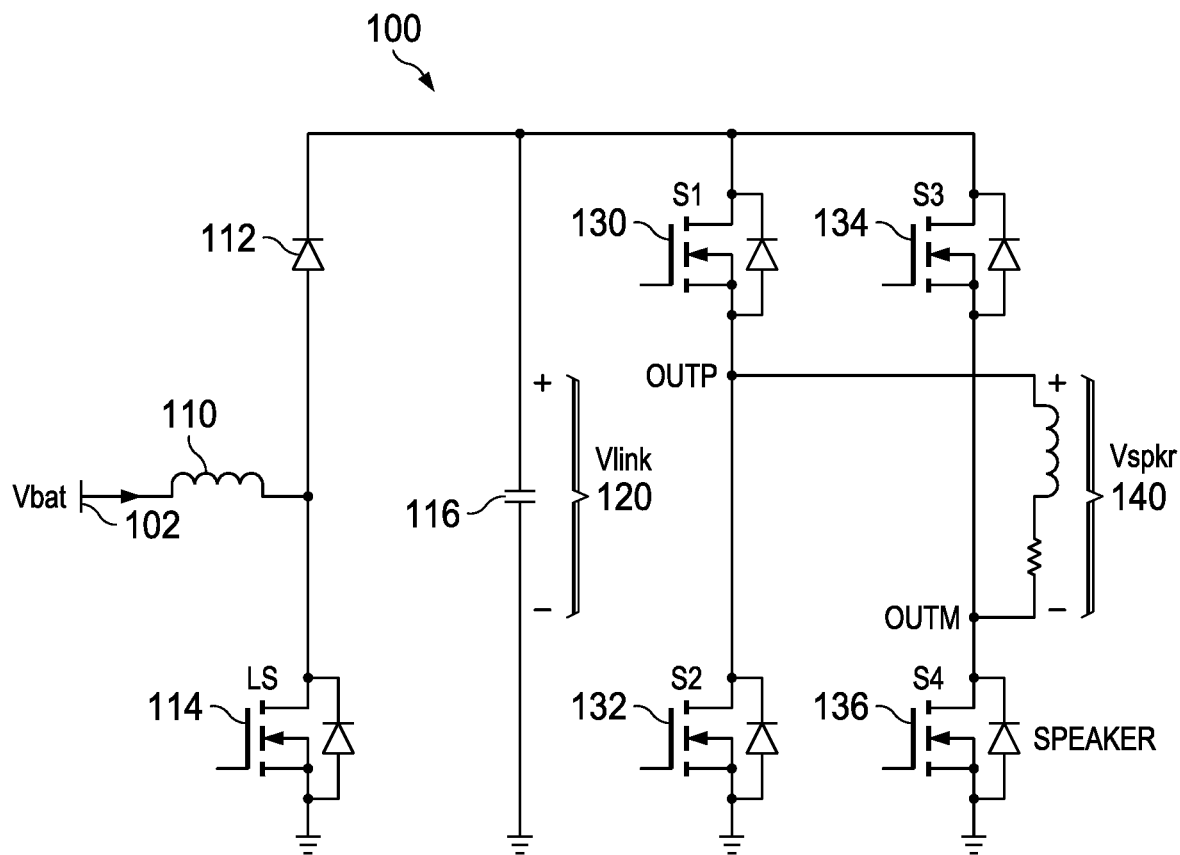
FIG. 1 shows an example output stage for a class D audio amplifier with an inductor-based boost converter.

FIG. 1 shows an example output stage 100 for a class D audio amplifier with an inductor-based boost converter. $V_{BAT}$ 102 is the supply voltage for the speaker driver. The supply voltage source could be a battery or any other DC power source. The inductor-based boost converter includes an inductor 110, a diode 112, a switch 114 and a capacitor 116. The inductor 110 receives the supply voltage $V_{BAT}$ 102 at a first terminal. The second terminal of inductor 110 is coupled to the anode of diode 112 and to a first current terminal of switch 114. The second current terminal of switch 114 is coupled to ground. In at least one example, switch 114 is a transistor. Capacitor 116 is coupled between the cathode of diode 112 and ground. The voltage across capacitor 116 supplies the upper rail voltage $V_{LINK}$ 120 to drive transistors 130 and 134. The boost converter boosts the supply voltage $V_{BAT}$ 102 to a higher voltage at $V_{LINK}$ 120 (e.g. from 3V to 10 V).

When the switch 114 is turned on, current flows from $V_{BAT}$ 102 to ground through the inductor 110 causing the inductor current to rise. When the switch 114 is turned off, the current that has built up in inductor 110 flows through the diode 112 and charges up capacitor 116, thus increasing $V_{LINK}$ 120. The inductor current decreases as the capacitor 116 is being charged. The inductor 110 acts as a current source to charge capacitor 116.

In at least one example, there is a feedback loop with an op amp (not shown) having a first op amp input coupled to the cathode of diode 112 sampling the voltage at $V_{LINK}$ 120, a second op amp input coupled to a reference voltage source, and an output coupled to the control terminal of switch 114. The feedback loop regulates the output at $V_{LINK}$ 120 to the desired voltage (e.g. 10V) by controlling the on time of switch 114.

Transistors 130 and 132 are connected in series between $V_{LINK}$ 120 and ground. The connection point of transistors 130 and 132 is labeled OUTP. Transistor 134 and 136 are also connected in series between $V_{LINK}$ 120 and ground. The connection point between transistors 134 and 136 is labeled OUTM. A speaker is connected between OUTP and OUTM. The differential voltage between OUTP and OUTM, which drives the speaker, is $V_{spkr}$ 140.

OUTP and OUTM are switching between $V_{LINK}$ 120 and ground. The differential voltage between OUTP and OUTM is provided as a square wave, but will be seen as a sine wave because the speaker acts as a lowpass filter on the OUTP and OUTM waveforms. If the speaker volume is increased, then the voltage across the speaker will increase. As the voltage across the speaker increases, the battery current from $V_{BAT}$ 102 will increase linearly with it. One method to limit the current being supplied by $V_{BAT}$ 102 is to sense the current through inductor 110 and turn off switch 114 when the current exceeds a current limit. This is not an ideal method for implementing battery current limit protection because inductors are large in comparison to other components, increasing the board space and component headroom required to fit the inductors. The requirement for added board space for the inductor makes the solution of FIG. 1 less desirable.

Figure 2:
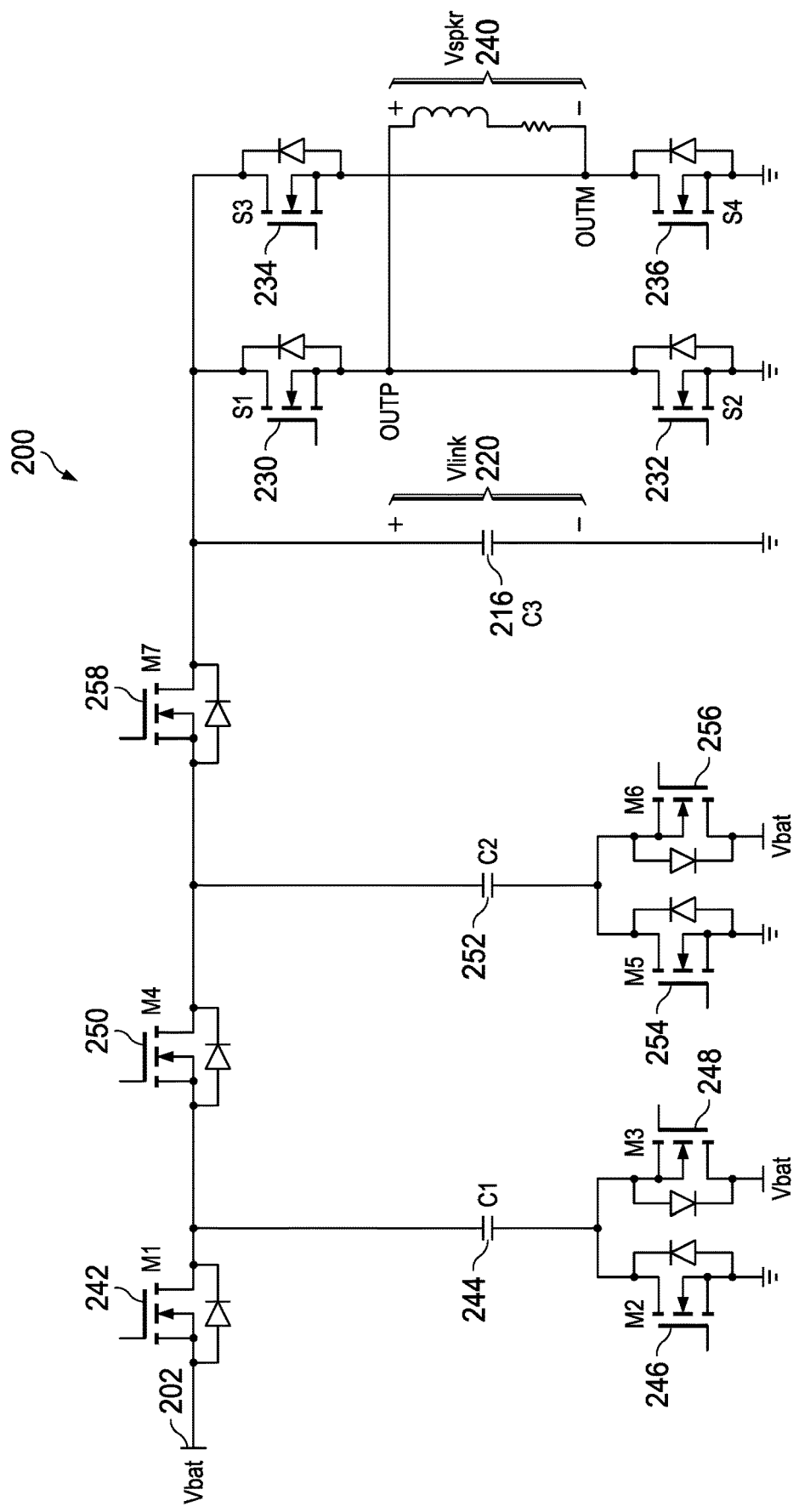
FIG. 2 shows an example output stage for a class D audio amplifier with a capacitor-based boost converter.

FIG. 2 shows an example output stage 200 for a class D audio amplifier with a capacitor-based boost converter. $V_{BAT}$ 202 is the supply voltage for the speaker driver. The supply voltage source could be a battery or any other DC power source. The capacitor-based boost converter shown has two stages, but more or less stages can be used in other examples. Each boost converter stage comprises a capacitor and two transistors, and each boost converter stage adds an amount $V_{BAT}$ to the voltage at $V_{BAT}$. So, having two boost converter stages results in a voltage equal to $3*V_{BAT}$ (or $V_{BAT}+V_{BAT}+V_{BAT}$) at $V_{LINK}$ 220. Transistors 242, 250 and 258 are switched on and off to sum the voltages and create the charge pump.

Transistors 246 and 248 are coupled in series between $V_{BAT}$ 202 and ground. Capacitor 244 has a first capacitor terminal connected to the connection point of transistors 246 and 248 and a second capacitor terminal connected to an output current terminal of transistor 242. Transistor 242 has an input current terminal receiving voltage $V_{BAT}$ 202. Transistors 242 and 246 are turned on while transistor 248 is turned off, charging capacitor 244 to a voltage of $V_{BAT}$ 202. The voltage across capacitor 244 is at $V_{BAT}$, and that capacitor voltage is added to the voltage at the output current terminal of transistor 242, which is also at a voltage of $V_{BAT}$ 202, by turning on switch 248. The result is that the voltage at the input current terminal of transistor 250 is $2*V_{BAT}$ (or $V_{BAT}+V_{BAT}$).

Similarly, transistors 254 and 256 are coupled in series between $V_{BAT}$ 202 and ground. Capacitor 252 has a first terminal connected between the connection point of transistors 254 and 256 and a second terminal connected to the output current terminal of transistor 250. Transistors 250 and 254 are turned on while transistor 256 is turned off, charging capacitor 252 to a voltage of $2*V_{BAT}$. The voltage across capacitor 252 is $2*V_{BAT}$, and that voltage is added to the voltage of $V_{BAT}$ 202 by turning on switch 256. The result is that the voltage at the input current terminal of transistor 258 is $3*V_{BAT}$ (or $V_{BAT}+V_{BAT}+V_{BAT}$).

Transistors 242, 250 and 258 turn on and turn off to create a charge pump, increasing the voltage $V_{LINK}$ 220 across capacitor 216. In example 200, $V_{LINK}=3*V_{BAT}$ because there are 2 charge pump stages and each charge pump stage increases the voltage $V_{LINK}$ 220 by the amount $V_{BAT}$. However, additional stages may be added if a higher ratio of $V_{LINK}$ to $V_{BAT}$ is desired.

Transistors 230 and 232 are connected in series between $V_{LINK}$ 220 and ground. The connection point of transistors 230 and 232 is labeled OUTP. Transistors 234 and 236 are also connected in series between $V_{LINK}$ 220 and ground. The connection point between transistors 234 and 236 is labeled OUTM. A speaker is connected between OUTP and OUTM. The differential voltage between OUTP and OUTM, which drives the speaker, is $V_{spkr}$ 240.

OUTP and OUTM are switching between $V_{LINK}$ 220 and ground. The differential voltage between OUTP and OUTM is provided to the speaker as a square wave, but will be seen as a sine wave because the speaker acts as a lowpass filter on the voltage waveform. If the speaker volume is increased, the voltage across the speaker will increase. As the voltage across the speaker increases, the battery current supplied by $V_{BAT}$ 202 will increase linearly with it.

Figure 3:
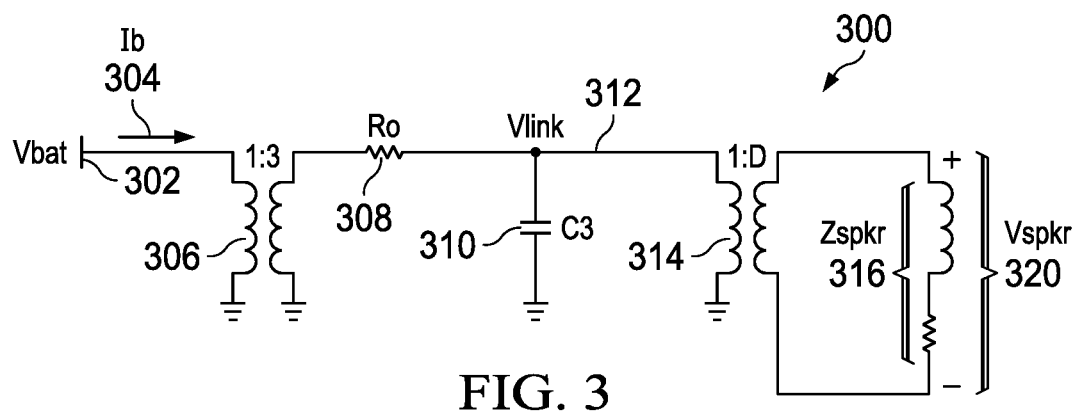
FIG. 3 shows an example circuit model for a class D audio amplifier with a capacitor-based boost converter.

FIG. 3 shows an example circuit model 300 for a class D audio amplifier with a capacitor-based boost converter. Circuit model 300 is an aid to understand the mathematical relationship between the speaker voltage $V_{spkr}$ 240 and the current supplied from $V_{BAT}$ 202. However, the circuit elements shown in circuit model 300 are not necessarily illustrative of the actual circuit elements in the embodiment. The battery voltage is represented as $V_{BAT}$ 302. The current supplied by the battery is represented as $I_B$ 304. Transformer 306 represents a charge pump. The transformer 306 is shown as having an input-to-output voltage ratio of 1:3, representing the voltage boosting of $V_{BAT}$ 302 to $V_{LINK}$ 312. Other examples may have a different boosting ratio of $V_{BAT}$ to $V_{LINK}$.

Ro 308 represents the impedance of the charge pump transistors (transistors 242, 250 and 258 in FIG. 2). The voltage across capacitor 310 is $V_{LINK}$ 312. A speaker is modeled as having an impedance $Z_{spkr}$ 316, which could be a combination of a resistance and an inductance. The voltage provided to the speaker is modeled as $V_{spkr}$ 320. Transformer 314 represents drive transistor S1-S4 (transistors 230, 232, 234 and 236 in FIG. 2). The transformer 314 is shown as having an input to output voltage ratio of 1:D representing the voltage ratio of $V_{LINK}$ 312 to $V_{spkr}$ 320. D represents the duty cycle or on-time of the high side transistors (transistors 230 and 234 in FIG. 2).

If the speaker is demanding a volume that requires current I through the speaker, then the current Ib 304 required from Vbat 302 will be equal to 3*I because the voltage Vspkr 320 is equal to 3*Vbat. To maintain constant power (power in=power out), the current will be reduced by a factor of N if the voltage is increased by a factor of N. While there is not an actual transformer in the circuit, the same principle of conservation of energy applies with a class D amplifier using a charge pump.

For example, if a system requirement is that no more than 2 A of current may be drawn from the battery, the speaker current must not exceed ⅔ A if $V_{LINK}$ is equal to 3*Vbat. If the speaker draws more than ⅔ A in this example, the battery current limit will be exceeded. One potential method to limit the battery current drawn is to increase the impedance of the charge pump transistors Ro 308 so that the voltage drop across Ro 308 is higher. A higher voltage drop across Ro 308 means that $V_{LINK}$ 312 will be lower. If $V_{LINK}$ 312 is lower, then Vspkr 320 will be lower, thus making the speaker current higher to maintain a constant power. So, an increase in the impedance of the charge pump transistors Ro 308 leads to a lower current draw from the battery. However, there is no direct control over Ro 308, and other methods, such as lowering the charge pump switching frequency to control Ro, result in thermal power loss, which lowers the power efficiency. Therefore, increasing the impedance of the charge pump transistors Ro 308 is not an attractive solution for limiting battery current.

Figure 4:
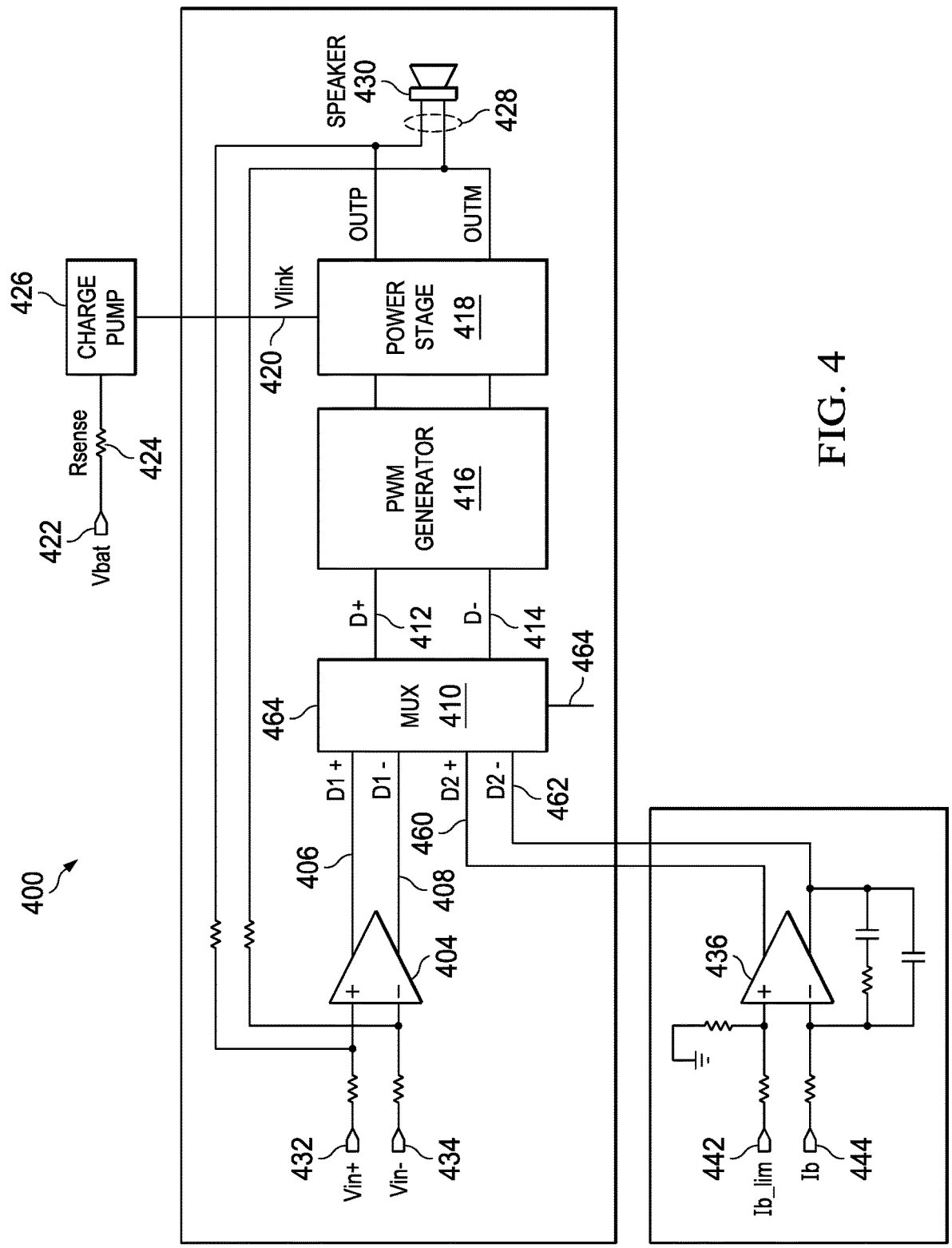
FIG. 4 shows a class D audio amplifier circuit having an improved current limit.

FIG. 4 shows a class D audio amplifier circuit 400 with an improved current limit. The differential audio signal $V_{IN+}$ 432 and $V_{IN-}$ 434 is coupled to the input terminals of amplifier 404. The output of amplifier 404 is differential signal D1+ 406 and D1− 408, which are coupled to the first input terminals of analog multiplexer 410. The output of multiplexer 410 is a differential signal D+ 412 and D− 414, which are provided to the input terminals of pulse-width-modulation (PWM) generator 416. The differential output of PWM generator 416 is coupled to the input of power stage 418. In some examples, power stage 418 includes power transistors capable of providing enough current to drive a speaker 430. Power stage 418 is supplied by the output of charge pump 426 which provides voltage $V_{LINK}$ 420 to power stage 418.

A first input terminal of amplifier 436 is coupled to a terminal providing a signal proportional to the battery current Ib 444. A second input terminal of amplifier 436 is coupled to a terminal providing a current limit reference voltage Ib_lim 442. The outputs of amplifier 436, differential signal $D_2+$ 460 and $D_2-$ 462, are coupled to the second input terminals of multiplexer 410. The output of multiplexer 410 is differential signal D+ 412 and D− 414, which is selected by multiplexer 410 to be either $D_1+$ 406 and $D_1-$ 408 or $D_2+$ 460 and $D_2-$ 462.

Figure 5:
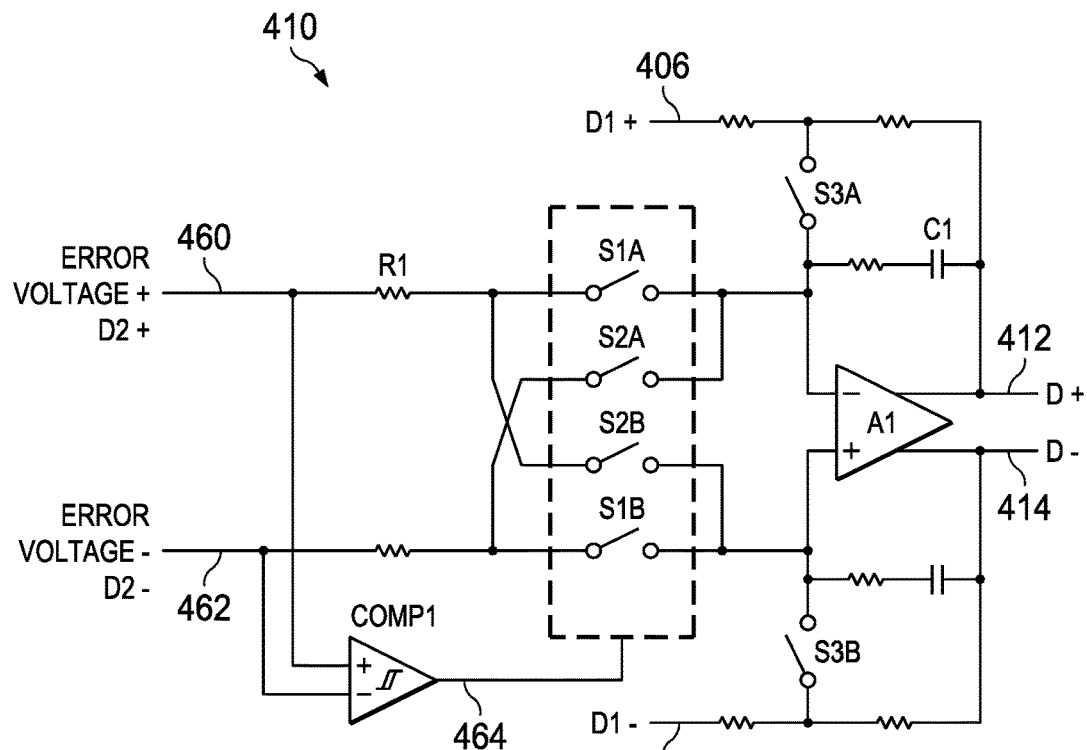
FIG. 5 shows an example implementation of a multiplexer for a class D audio amplifier circuit.

FIG. 5 shows an example implementation of multiplexer 410. Error voltage outputs $D_2+$ 460 and $D_2-$ 462, respectively, are coupled to the first and second input terminals of comparator COMP1. The output 464 of comparator COMP1 controls the position of switches S1 A/B, S2 A/B and S3 A/B. When the circuit is in normal operation and the battery current is within the battery current limit, switch S3 A/B is closed and switches S1 A/B and S2 A/B are open. If the supplied battery current exceeds the battery current limit, switch S3 A/B is opened and switches S1 A/B and S2 A/B close.

Figure 6:
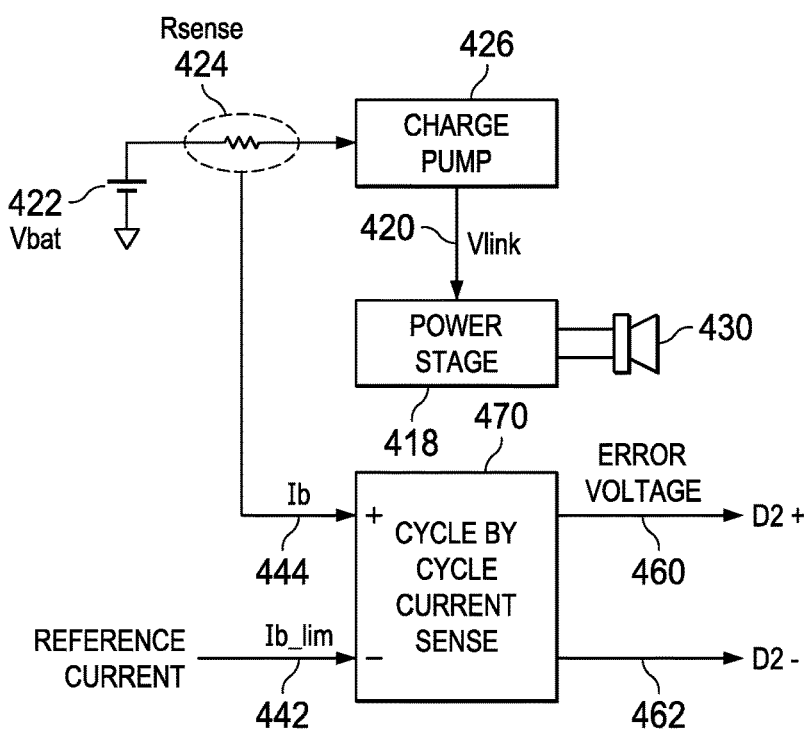
FIG. 6 shows an example implementation of a circuit for generating error voltages for controlling a multiplexer for a class D audio amplifier circuit.

FIG. 6 shows an example implementation of a circuit for generating error voltage outputs $D_2+$ 460 and $D_2-$ 462. Voltage source $V_{bat}$ 422 is coupled to the input of charge pump 426 through current sensing resistor $R_{sense}$ 424. The output of charge pump 426 is $V_{LINK}$ 420, which provides power to the amplifier power stage 418 to drive the speaker 430. The current drawn from the battery Ib 444 is sensed by $R_{sense}$ 424. Battery current Ib 444 is provided as a first input to current sense circuit 470. The second input of current sense circuit 470 is Ib_lim 442, which is a reference voltage that sets the battery current limit value. Current sense circuit 470 provides at its output an error voltage representing the difference between the battery current being supplied and the battery current limit. The output of current sense circuit 470 is $D_2+$ 460 and $D_2-$ 462, which are coupled to the first and second inputs, respectively, of COMP1 464.

If the battery current Ib 444 is lower than the battery current limit Ib_lim 442, the error voltage $D_2+$ 460 and $D_2-$ 462 will be positive, making the output of COMP1 464 high. When the output of COMP1 464 is high, switch S3 will be closed and switches S1 and S2 will be open. With switch S3 closed and switches S1 and S2 open, the input to amplifier A1 will be coupled to $D_1+$ 406 and $D_1-$ 408.

If the battery current Ib 444 is higher than the battery current limit Ib_lim 442, the error voltage $D_2+$ 460 and $D_2-$ 462 will be negative, making the output of COMP1 464 low. When the output of COMP1 464 is low, switch S3 will be open and switches S1 and S2 will be closed. With switch S3 open and switches S1 and S2 closed, the input to amplifier A1 will be coupled to $D_2+$ 460 and $D_2-$ 462.

Amplifier A1, which is configured as an integrator in at least one example, has a differential output D+ 412 and D− 414, which corresponds to a duty cycle D for the PWM signal that will control how the speaker 430 is driven, and thus how much current is required from the battery. The input of PWM generator 416 is coupled to the output of MUX 410. The output of PWM generator 416 is coupled to the input of power stage 418, which is powered by voltage $V_{LINK}$ 420. Voltage $V_{LINK}$ 420 is generated by charge pump 426 which draws battery current Ib 444 to drive speaker 430. The output of power stage 418 is OUTP and OUTM, which drives speaker 430, and are also coupled to the input terminals of amplifier 404.

The battery current Ib 444 is proportional to the current through $V_{LINK}$ 420. The current through $V_{LINK}$ 420 is proportional to the speaker current, which is proportional to the voltage across the speaker, OUTP and OUTM. Therefore, to limit the input battery current, the voltage across the speaker must be limited, and this is done by controlling the duty cycle D, the output of mux 410, D+ 412 and D− 414.

As used herein, the terms "terminal", "node", "interconnection", "lead" and "pin" are used interchangeably. Unless specifically stated to the contrary, these terms are generally used to mean an interconnection between or a terminus of a device element, a circuit element, an integrated circuit, a device, or other electronics or semiconductor component.

Uses of the phrase "ground" in the foregoing description include a chassis ground, an Earth ground, a floating ground, a virtual ground, a digital ground, a common ground, and/or any other form of ground connection applicable to, or suitable for, the teachings of this description.

In this description, even if operations are described in a particular order, some operations may be optional, and the operations are not necessarily required to be performed in that particular order to achieve desirable results. In some examples, multitasking and parallel processing may be advantageous. Moreover, a separation of various system components in the embodiments described above does not necessarily require such separation in all embodiments.

Modifications are possible in the described embodiments, and other embodiments are possible, within the scope of the claims.

What is claimed is:

1. An audio amplifier circuit comprising:
a power source terminal;
a first amplifier having a differential first amplifier input and a differential first amplifier output, the differential first amplifier input adapted to be coupled to an audio input source;
a multiplexer having first and second mux inputs, a control input and a mux output, the first mux input coupled to the differential first amplifier output;
a signal generator having a generator input and a generator output, the generator input coupled to the mux output;
a driver circuit having a driver circuit input and a driver circuit output, the driver circuit input is coupled to the generator output, and the driver circuit output is differential and coupled to first and second speaker drive terminals; and
a second amplifier having first and second error inputs and an error output, the first error input coupled to a current sense terminal configured to provide a voltage proportional to a supply current supplied through the power source terminal, the second error input coupled to a current limit terminal configured to provide a reference voltage proportional to a current limit value.

2. The audio amplifier circuit of claim 1, additionally comprising a charge pump having a charge pump input and a charge pump output, the charge pump input coupled to the power source terminal, and the charge pump output coupled to a voltage source input of the driver circuit.

3. The audio amplifier circuit of claim 2, wherein the driver circuit comprises first, second, third and fourth field effect transistors (FETs), and a control terminal of each of the first, second, third and fourth FETs, respectively, is coupled to the generator output.

4. The audio amplifier circuit of claim 3, wherein:
the first FET has first and second FET current terminals, the first FET current terminal is coupled to the charge pump output, and the second FET current terminal is coupled to the first speaker drive terminal;
the second FET has third and fourth FET current terminals, the third FET current terminal is coupled to the second FET current terminal, and the fourth FET current terminal is coupled to a ground terminal;
the third FET has fifth and sixth FET current terminals, the fifth FET current terminal is coupled to the charge pump output, and the sixth FET current terminal is coupled to the second speaker drive terminal; and
the fourth FET has seventh and eighth FET current terminals, the seventh FET current terminal is coupled to the sixth FET current terminal, and the eighth FET current terminal is coupled to the ground terminal.

5. The audio amplifier circuit of claim 1, wherein the multiplexer includes:
a first switch having a first switch input, a first switch output and a first switch control terminal, the first switch input coupled to the error output;
a second switch having a second switch input, a second switch output and a second switch control terminal, the second switch input coupled to the error output;
a third switch having a third switch input, a third switch output and a third switch control terminal, the third switch input coupled to the differential first amplifier output; and
a third amplifier having a differential third amplifier input and a differential third amplifier output, the differential third amplifier input coupled to the first, second and third switch outputs, and the differential third amplifier output coupled to the generator input.

6. The audio amplifier circuit of claim 5, wherein the third amplifier is configured as an integrator.

7. The audio amplifier circuit of claim 5, including a comparator having first and second comparator inputs and a comparator output, the first comparator input coupled to the error output, the second comparator input coupled to the error output, and the comparator output coupled to the first, second and third switch control terminals.

8. The audio amplifier circuit of claim 7, wherein the first and second switches are closed and the third switch is open in response to the comparator output having a first logic state, and the first and second switches are open and the third switch is closed in response to the comparator output having a second logic state.

9. The audio amplifier circuit of claim 1, wherein the generator output provides a pulse-width-modulated (PWM) signal having a duty cycle responsive to the generator input.

10. The audio amplifier circuit of claim 1, wherein the first and second speaker drive terminals are adapted to be coupled to a speaker.

11. The audio amplifier circuit of claim 2, wherein the charge pump is a capacitor-based charge pump.

12. A speaker system comprising:
a first amplifier having a differential first amplifier input and a differential first amplifier output, the differential first amplifier input adapted to be coupled to an audio input source;
a multiplexer having first and second mux inputs, a control input and a mux output, the first mux input coupled to the differential first amplifier output;
a signal generator having a generator input and a generator output, the generator input coupled to the mux output;
a driver circuit having a driver circuit input and a driver circuit output, the driver circuit input is coupled to the generator output, and the driver circuit output is differential and coupled to first and second speaker drive terminals;
a speaker having first and second speaker terminals coupled to the first and second speaker drive terminals, respectively; and
a second amplifier having first and second error inputs and an error output, the first error input coupled to a current sense terminal configured to provide a voltage proportional to a power supply current, the second error input coupled to a current limit terminal configured to provide a reference voltage proportional to a current limit value.

13. The speaker system of claim 12, additionally comprising a charge pump having a charge pump input and a charge pump output, the charge pump input coupled to a power supply input terminal, and the charge pump output adapted to be coupled to a voltage source input of the driver circuit.

14. The speaker system of claim 13, wherein the driver circuit comprises first, second, third and fourth field effect transistors (FETs), and a control terminal of each of the first, second, third and fourth FETs, respectively, is coupled to the generator output.

15. The speaker system of claim 14, wherein:
the first FET has first and second FET current terminals, the first FET current terminal coupled to the charge pump output, and the second FET current terminal coupled to the first speaker terminal;

the second FET has third and fourth FET current terminals, the third FET current terminal coupled to the second FET current terminal, and the fourth FET current terminal coupled to a ground terminal;

the third FET has fifth and sixth FET current terminals, the fifth FET current terminal coupled to the charge pump output, and the sixth FET current terminal coupled to the second speaker terminal; and the fourth FET has seventh and eighth FET current terminals, the seventh FET current terminal coupled to the sixth FET current terminal, and the eighth FET current terminal coupled to the ground terminal.

16. The speaker system of claim 12, wherein the multiplexer includes:

a first switch having a first switch input terminal, a first switch output terminal and a first switch control terminal, the first switch input terminal coupled to the error output;

a second switch having a second switch input terminal, a second switch output terminal and a second switch control terminal, the second switch input terminal coupled to the error output;

a third switch having a third switch input terminal, a third switch output terminal and a third switch control terminal, the third switch input terminal coupled to the differential first amplifier output; and a third amplifier having a differential third input and a differential third output, the differential third input coupled to the first, second and third switch output terminals, and the differential third output coupled to the generator input.

17. The speaker system of claim 16, wherein the third amplifier is configured as an integrator.

18. The speaker system of claim 16, including a comparator having first and second comparator inputs and a comparator output, the first comparator input coupled to the error output, the second comparator input coupled to the error output, and the comparator output coupled to the first, second and third switch control terminals.

19. The speaker system of claim 18, wherein the first and second switches are closed and the third switch is open in response to the comparator output having a first logic state, and the first and second switches are open and the third switch is closed in response to the comparator output having a second logic state.

20. The speaker system of claim 12, wherein the generator output provides a pulse-width-modulated (PWM) signal having a duty cycle responsive to the generator input.

21. An audio amplifier circuit comprising:

a first amplifier having a differential first amplifier input and a differential first amplifier output, the differential first amplifier input adapted to be coupled to an audio input source;

a multiplexer having first and second mux inputs, a control input and a mux output, the first mux input coupled to the differential first amplifier output;

a signal generator having a generator input and a generator output, the generator input coupled to the mux output;

a driver circuit having a driver circuit input and a driver circuit output, the driver circuit input is coupled to the generator output, and the driver circuit output is differential and coupled to first and second speaker drive terminals; and a second amplifier having first and second error inputs and an error output, the first error input coupled to a current sense terminal configured to provide a voltage proportional to a power supply current, the second error input coupled to a current limit terminal configured to provide a reference voltage proportional to a current limit value;

wherein, the multiplexer selects the first mux input when the power supply current is less than the current limit value, and selects the second mux input when the power supply current is greater than the current limit value.

22. The audio amplifier circuit of claim 21, wherein the generator output provides a pulse-width-modulated (PWM) signal having a duty cycle responsive to the mux output.

23. The audio amplifier circuit of claim 21, wherein the first and second speaker drive terminals are adapted to be coupled to a speaker.

* * * * *